United States Patent [19]
Wells et al.

[11] Patent Number: 4,851,784
[45] Date of Patent: Jul. 25, 1989

[54] PHASE COMPARATORS

[75] Inventors: John N. Wells; Neil E. Thomas, both of St. Albans, United Kingdom

[73] Assignee: Marconi Instruments Limited, Longacres, United Kingdom

[21] Appl. No.: 168,311

[22] Filed: Mar. 18, 1988

[51] Int. Cl.⁴ .......................... H03K 9/06; H03K 5/26
[52] U.S. Cl. .................... 328/133; 328/109; 307/514; 307/262; 307/479
[58] Field of Search ................ 328/133, 109; 307/510, 307/514, 262, 479

[56] References Cited

U.S. PATENT DOCUMENTS 3,469,198  9/1969  Madsen ............................. 328/133
3,610,954 10/1971  Treadway ......................... 328/133
4,764,737  8/1988  Kaatz ................................ 328/133

Primary Examiner—Stanley D. Miller
Assistant Examiner—Richard Roseen
Attorney, Agent, or Firm—Lowe, Price, LeBlanc, Becker & Shur

[57] ABSTRACT

A phase comparator accepts two streams of digital pulses, one being a reference signal and the other a test signal, and generates an output signal indicative of the phase difference. The phase comparator can be implemented as a four-state device or higher, and thus exhibits a wide phase capture range, i.e. multiples of 360°, and can provide a stable, predictable and linear output signal when the two input signals are in lock. It is therefore very suitable for use in a phase locked loop in which temporary wide variations in phase can occur.

3 Claims, 5 Drawing Sheets

STATE NO: Q1 Q2 Q3

\* UNSTABLE STATE

PHASE COMPARATORS

FIELD OF THE INVENTION

This invention relates to phase comparators, and is particularly suited for giving an indication of phase and frequency difference between two digital pulse streams in a manner which enables frequency and phase coincidence of the two pulse streams to be clearly and accurately determined in an unambiguous manner. One instance in which the need for such a phase comparator can arise is in a phase lock loop, which includes a variable frequency element, and it can be used to bring a variable frequency into exact agreement with a reference frequency. It is particularly desirable that if the two inputs drift out of lock, the comparator gives a clear indication of the polarity of the frequency difference, and also that when the two signals are exactly in lock the output of the phase comparator is wholly predictable and does not contain disruptive signal level transitions.

DESCRIPTION OF THE BACKGROUND ART

One of the simplest phase comparators can be termed a two-state device in that it adopts one output logic state when one input transition occurs, and it adopts the other output logic state when the other input transition occurs. Such a phase comparator is capable of exhibiting good linearity over one cycle of phase difference, but once the phase of either signal differs by more than a half cycle from lock, the absolute phase information is lost. For most applications a two-state phase comparator has an unusable capture performance.

A three-state phase comparator, has a wide capture range, but it suffers from output non-linearity when the two input signals are in lock or nearly so, and it is at just this point that the most predictable and stable output signal is generally needed for control purposes.

A four or higher state phase comparator is capable of providing a wide capture range, but such a device has proved very difficult to implement in a practical manner without resulting in a very complex arrangement which is susceptible to race problems which is operable only at relatively low frequencies. Race problems occur when sequences of events cause logic signal intervals at the comparator to occur out of the correct order or in an unpredictable manner, giving rise to incorrect results or an unusable output signal.

SUMMARY OF THE INVENTION

The present invention seeks to provide an improved phase comparator.

According to this invention a phase comparator includes means for receiving two streams of digital signals; a pair of input bistable logic means each of which is arranged to receive a respective one of said streams which is operative to influence its logic state.

Each input bistable means having an output which is connected to a further bistable logic means in such a manner that a coupled pair of bistable means is formed which is stable in three of its four possible logic states, but is unstable in a fourth state which when adopted, reverts to one of said three stable states; and means utilising said logic states to provide an indication of the phase difference between said streams of digital signals.

In the case of a phase comparator having three bistable means; that is to say, two input bistable logic means sharing a common interconnected further bistable logic means, a four-state phase comparator results. When the two input streams of digital signals are in lock, two of the logic states interchange with an equal dwell time in each state, i.e. the output phase pulse signal has a unity mark-space ratio. As the phase difference increases, the mark-space ratio changes in a predictable manner. By providing more bistables interconnected in a similar manner to said further bistable, five-state, six-state and higher order phase comparators can be readily implemented, thereby providing in effect a memory of multiple whole cycle phase differences. Although it is envisaged that the phase comparator will be implemented using digital electrical circuits, the possibility of optical bistable logic means is not excluded.

BRIEF DESCRIPTION OF THE DRAWINGS

The invention is further described by way of example with refernece to the accompanying drawings which illustrate a digital phase comparator in which.

DESCRIPTION OF THE PREFERRED EMBODIMENTS

Figure 1:
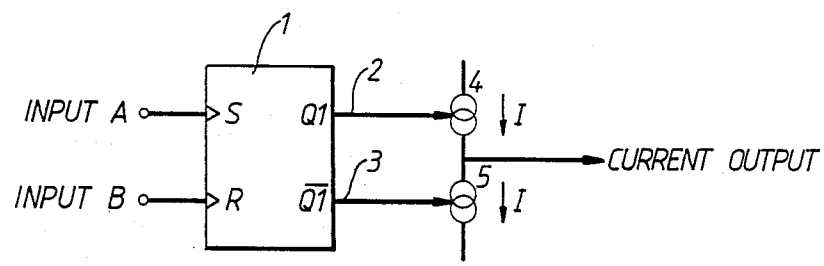
FIG. 1 illustrates a simple two-state phase comparator.

Referring to FIG. 1 there is shown therein a very simple two-state phase comparator by way of explanation. It consists of a simple edge triggered bistable 1 having two outputs 2 and 3 which control current sources 4 and 5. The two input pulse streams are termed "input A" and the other "input B", and in practice one of the inputs is likely to be a reference waveform and the other a test waveform which is to be phase compared with the other. These two inputs are applied respectively to the set S and re-set R terminals of the bistable 1, and the outputs 2 and 3 constitute what are normally termed the Q and $\bar{Q}$ outputs. If the bistable 1 is driven with two input waveforms in which the phases are such that transitions on input A occur just before those on input B, then phase comparator output will be low for nearly all of the time. Likewise if the transitions occur first on input B then the output signal will be high virtually all of the time. In the case where the transitions on the two waveforms occur mid-way between each other then the output would be a unity mark-to-space ratio. Although the outputs of terminals 2 and 3 represent pulse waveforms the actions of the current sources 4 and 5 is to generate an output current having an amplitude related to the phase difference.

Figure 2:
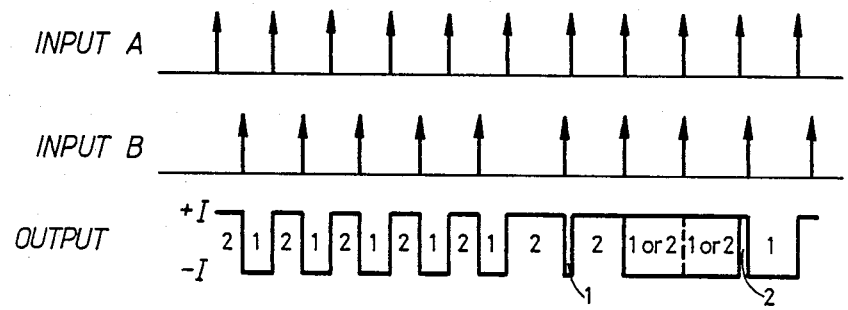
FIGS. 2 and 3 are associated explanatory diagrams.

FIG. 2 shows in diagramatic form a representation of the two inputs A and B in pulse form, together with the resulting output waveform in this case assumed to be present on output port 2. The bounds of operation of this simple two-state edge triggered phase comparator are thus 0° to 360°, i.e. a single cycle, with a sharp output discontinuity occurring when these bounds are exceeded. The normal in-lock condition is at 180° giving a unity mark-to-space ratio. This simple device is termed a two-state phase comparator since it has only two different internal states.

Figure 3:
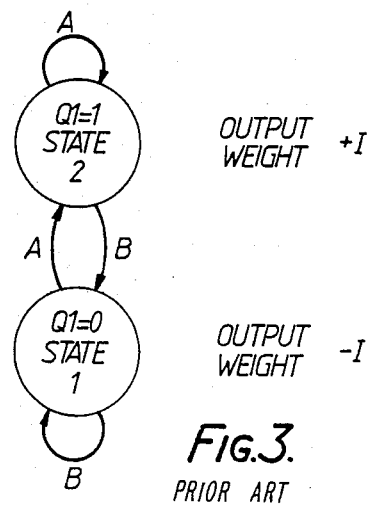

FIG. 3 illustrates in some symbolic fashion the stable state diagram for the two-state phase comparator shown in FIG. 1. It indicates that if the bistable is such that its Q output is at a logic 0, it will remain in that state if the next input pulse is received at input B, whereas it will revert to state 2 in which the Q output is a logical 1 if the next input state is on input A.

Figure 4:
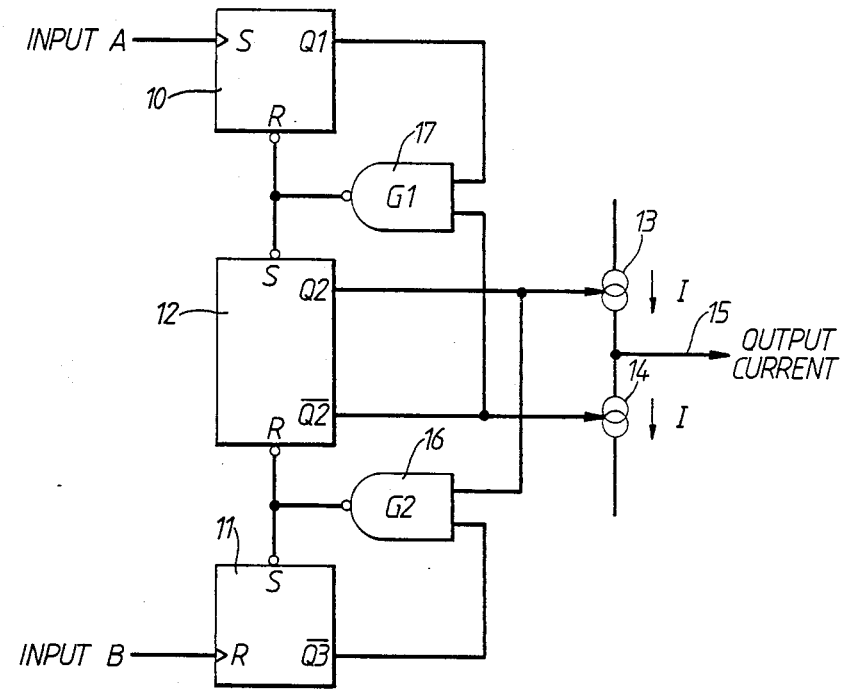
FIG. 4 shows a diagramatic implementation of a four-state phase comparator.
Figure 5:
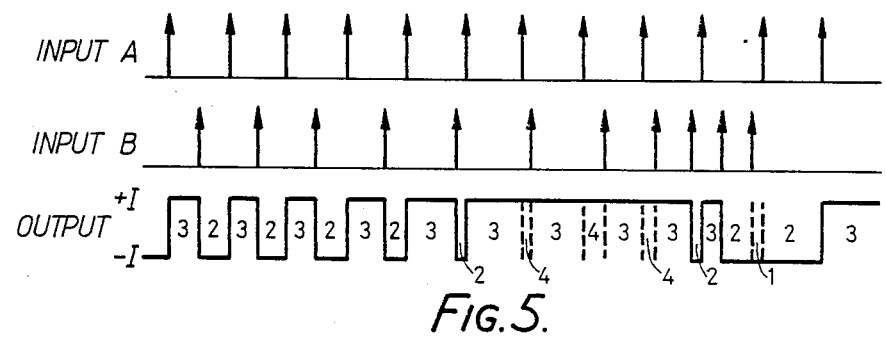
FIGS. 5, 6 and 7 are explanatory diagrams.

Referring to FIG. 4, there is shown therein a simplified implementation of a four-state phase comparator in accordance with the present invention. It includes two similar bistable devices 10 and 11 both having set and reset inputs S and R respectively and Q and $\overline{Q}$ outputs, although in the case of bistable 10, only the output Q1 is illustrated and in the case of bistable 11 only the output Q3 is illustrated. The further bistable device 12 is associated with both of the first bistables 10 and 11 and the set input of bistable 12 is connected directly to the reset input of bistable 10, whereas the reset input of bistable 12 is connected to the set input of bistable 1. The outputs of the phase comparator are represented by the Q2 and $\overline{Q2}$ outputs of bistable 12 which are fed via a pair of current sources 13 and 14 to a single output port 15. The output of the Q2 port of bistable 12 is fed via an NAND gate 16 to the set input of bistable 11 and the reset input of bistable 12. Similarly the Q1 output of bistable 10 is fed via a further NAND gate 17 to the set input of bistable 12 and the reset input of bistable 10 as shown.

Figure 6:
Figure 6:
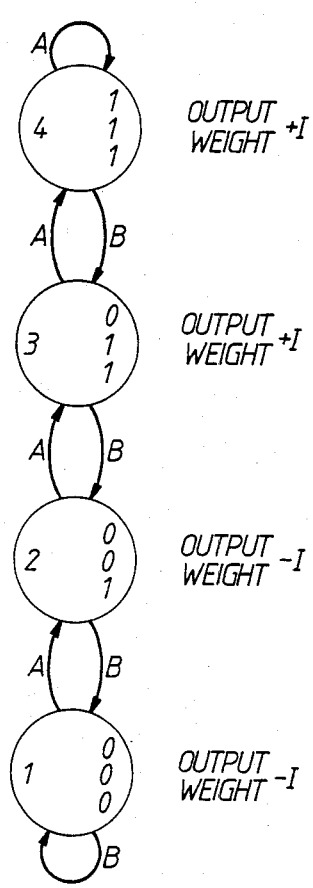

The circuit illustrated in FIG. 4 operates as follows. Consider NAND gate 17. It has an upper and lower bistable, respectively bistables 10 and 12, associated with it. The output of NAND gate 17 goes active only when the upper bistable 10 is set and the lower bistable 12 is reset. The effect of its output going active is to reset the upper bistable 10 and to set the lower bistable 12. NAND gate 16 behaves identically with its bistables 12 and 11. It is helpful to consider the condition which causes the gates 16 and 17 to produce an output—this is an unstable condition as both bistables change state as soon as it occurs and the effect is to propagate sets downwards and resets upwards. A consequence of this in FIG. 4 is that of the possible eight states that three bistables can adopt, only a limited number of these possible states are stable. It turns out that there are a total of four stable states and these are represented diagramatically in a state diagram in FIG. 6. The pattern of the four stable states represents a thermometer type counter where the number of set bistables represents the state of the phase comparator. The number of set bistables is indicated by the logic binary values 0 or 1 shown at the right hand side of each circle representing the four possible states.

Figure 7:
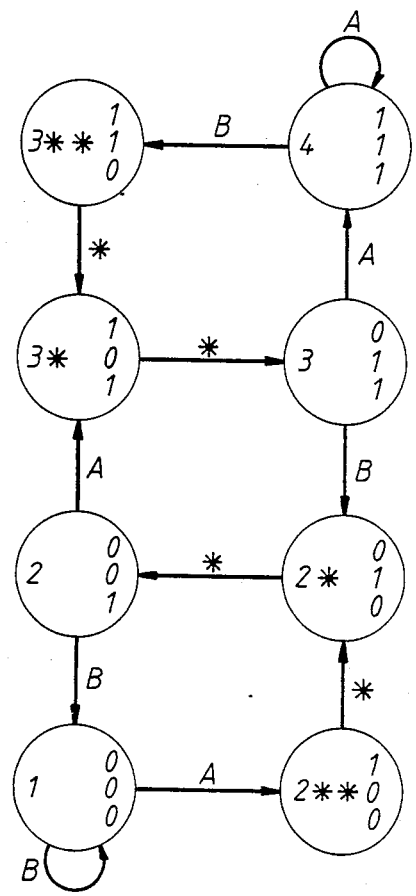

Considering the transition between state 2 and state 1 due to a B input, the B transition resets Q3 and the circuit finishes in a stable state and nothing further happens. However, consider the transition between the state 1 and state 2 due to an A input. The A transition sets Q1 output. As output Q2 is not set, Q1 and Q2 are unstable—this state is marked 2** and is illustrated in FIG. 7. Thus Q1 and Q2 invert and the set propagates to the second bistable, (state 2* in FIG. 7). Q2 and Q3 are now unstable and they invert making the final transition to state 2. If another A input next occurs another set propagates down the chain of bistables, but this time only as far as Q2 as it reaches Q3 set. If a B input occurs a reset rises through the chain until it reaches a reset bistable.

In order to provide a weighting network in which the output current is indicative of the output states, the two current sources 13 and 14 are driven from the Q2 and $\overline{Q2}$ outputs, these give a +1 output for states 3 and 4 and −1 output for states 1 and 2. As there is no zero weight state, lock occurs at 180° phase shift between the two input pulse streams A and B. As each terminal state, i.e. states 1 and 4 has an adjacent state of the same sign, the capture performance is superior to that of a three-state comparator. The output signal for in-lock inputs is stable, predictable and linear.

Figure 8:
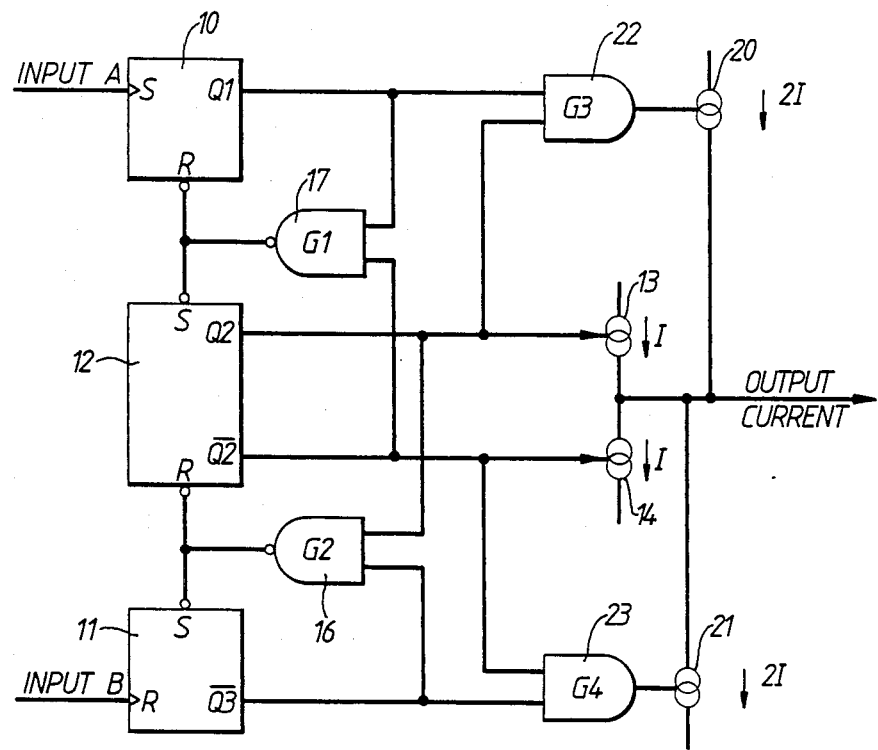
FIG. 8 shows a more complete implementation.

FIG. 8 shows a slightly modified and extended version of the phase comparator shown in FIG. 4 in which a weighting network gives a linear output characteristic over the whole phase range and not just the center 360°, as is the case with FIG. 4. This additional range is achieved by adding two further current sources 20,21 controlled by outputs Q1 and $\overline{Q3}$ gated via gates 22,23 with outputs Q2 and $\overline{Q2}$ to eliminate the spurious outputs which can occur on Q1 and $\overline{Q3}$.

By use of a modified weighting network a very fast pull-in can be achieved following loss of lock in a circuit in which the phase comparator is used to close a phased locked loop. This is achieved by using even larger current sources 20, 21 on the gated outputs of Q1 and $\overline{Q3}$.

Figure 9:
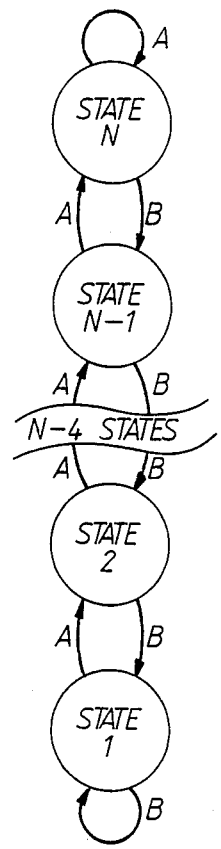
FIGS. 9 and 10 are diagrams relating to a generalised n-state phase comparator.
Figure 10:
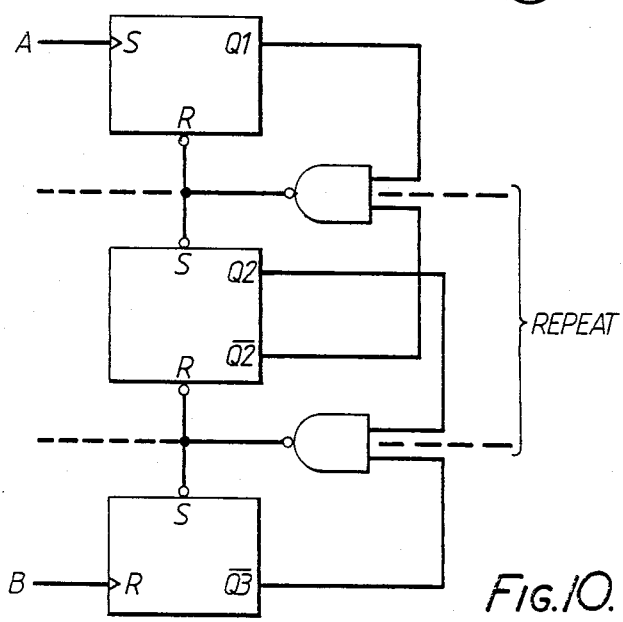

The principle of the four-state comparator can be extended to a large number of states as necessary. The concept of an n-state machine is illustrated in FIG. 9. The way in which it would be implemented is shown in FIG. 10 in which the section shown within the broken line would be repeated as often as is necessary. Thus additional bistables would be inserted and for each additional bistable an additional NAND Gate would be provided. The broken lines are shown down the middle of each NAND Gate so as to indicate more clearly those elements of the circuit which are repeated. By including extra bistables, the phase capture range is extended, and linear operation is achievable over many multiples of 360° phase difference, the bistables serving to preserve memory of these multiple values.

We claim:

1. A phase comparator including means for receiving two streams of digital signals; a pair of input bistable logic means each of which is arranged to receive a respective one of said streams which is operative to influence its logic state; each input bistable means having an output which is connected to a further bistable logic means said further bistable logic means and said pair of input bistable logic means together are stable in four of its eight possible logic states, but is unstable in the other states which when adopted, reverts to one of said four stable states; and means utilising output of said logic states to provide an indication of the phase difference between said streams of digital signals.

2. A phase comparator as claimed in claim 1 and wherein each input bistable logic means has an output which is gated back to an set/reset terminals of the same input bistable logic means and the further bistable logic means to which it is coupled, it being gated in combination from an output of said further bistable logic means.

3. A phase comparator as claimed in claim 1 and wherein said utilising means is arranged to generate an output analogue signal having a magnitude and polarity indicative of the phase difference of the two streams of digital signals.

* * * * *